(12) United States Patent
Michalski

(10) Patent No.: US 7,019,580 B1
(45) Date of Patent: Mar. 28, 2006

(54) NMOS COMPOSITE DEVICE VDS BOOTSTRAPPERS

(75) Inventor: Christopher Joseph Michalski, Belews Creek, NC (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 0 days.

(21) Appl. No.: 10/807,973

(22) Filed: Mar. 24, 2004

Related U.S. Application Data

(60) Provisional application No. 60/519,041, filed on Nov. 11, 2003.

(51) Int. Cl.
*H03K 17/687* (2006.01)

(52) U.S. Cl. ...................... 327/427; 327/530

(58) Field of Classification Search ............... 327/379, 327/391, 427, 434, 436–437, 541–546, 566, 327/530
See application file for complete search history.

(56) References Cited

U.S. PATENT DOCUMENTS

| | | | | |
|---|---|---|---|---|
| 4,638,241 A | * | 1/1987 | Colles | ......................... 323/312 |
| 6,140,876 A | * | 10/2000 | Yero | ........................... 330/253 |
| 6,501,318 B1 | * | 12/2002 | Randazzo et al. | ........... 327/309 |
| 6,696,880 B1 | * | 2/2004 | Pan et al. | .................... 327/390 |
| 6,803,801 B1 | * | 10/2004 | Randazzo et al. | ........... 327/333 |

OTHER PUBLICATIONS

Grebene, Alan B., "Bipolar and MOS Analog Integrated Circuit Design", 1984, p. 110.

* cited by examiner

*Primary Examiner*—My-Trang Nu Ton
(74) *Attorney, Agent, or Firm*—Blakely, Sokoloff, Taylor & Zafman LLP

(57) ABSTRACT

NMOS composite device Vds bootstrappers that mitigate the effects of decreased power supply rejection and increased channel length modulation in minimum or short channel length devices. The NMOS composite devices have a native or at least a low threshold device over a short channel device, with the gate of the native or low threshold device being controlled responsive to the input or output of the short channel device to clamp the drain—source voltage of the short channel device while holding the short channel device in saturation. In one embodiment, a native device is used, with the gate or the native device being connected to the gate of the short channel device. Other embodiments, including embodiments in the form of source followers having enhanced linearity are disclosed.

31 Claims, 5 Drawing Sheets

Figure 1: Composite Device

Figure 2: Source-Follower Configuration

Figure 3: AC-Coupled Bias of Native Gate

NMOS COMPOSITE DEVICE VDS BOOTSTRAPPERS

CROSS-REFERENCE TO RELATED APPLICATION

This application claims the benefit of U.S. Provisional Patent Application No. 60/519,041 filed Nov. 11, 2003.

BACKGROUND OF THE INVENTION

1. Field of the Invention

The present invention relates to the field of CMOS analog circuits and CMOS analog circuit design.

2. Prior Art

The design of analog circuits in state of the art CMOS process technology involves the use of minimum channel length devices. The benefits of minimum channel length devices are increased device speed (i.e. ft) and reduced bulk parasitics. The drawbacks of a minimum channel length device include increased 1/f noise and channel length modulation, among others. Ideally when a MOS device operates in saturation, the drain current would be independent of the drain-source voltage, thereby having an infinite output resistance. In fact, however, channel length modulation causes an increase in the drain current with drain voltage for a constant gate-source voltage when operating in the saturation region, much like the Early effect in bipolar junction transistors. (See for instance Figure 2.42 on page 110 of "Bipolar and MOS Analog Integrated Circuit Design" by Alan B. Grebene.) Thus channel length modulation causes a decrease in the effective output resistance of a device and can have derogatory effects on the linearity of a basic source follower circuit.

DETAILED DESCRIPTION OF THE PREFERRED EMBODIMENTS

Figure 1:
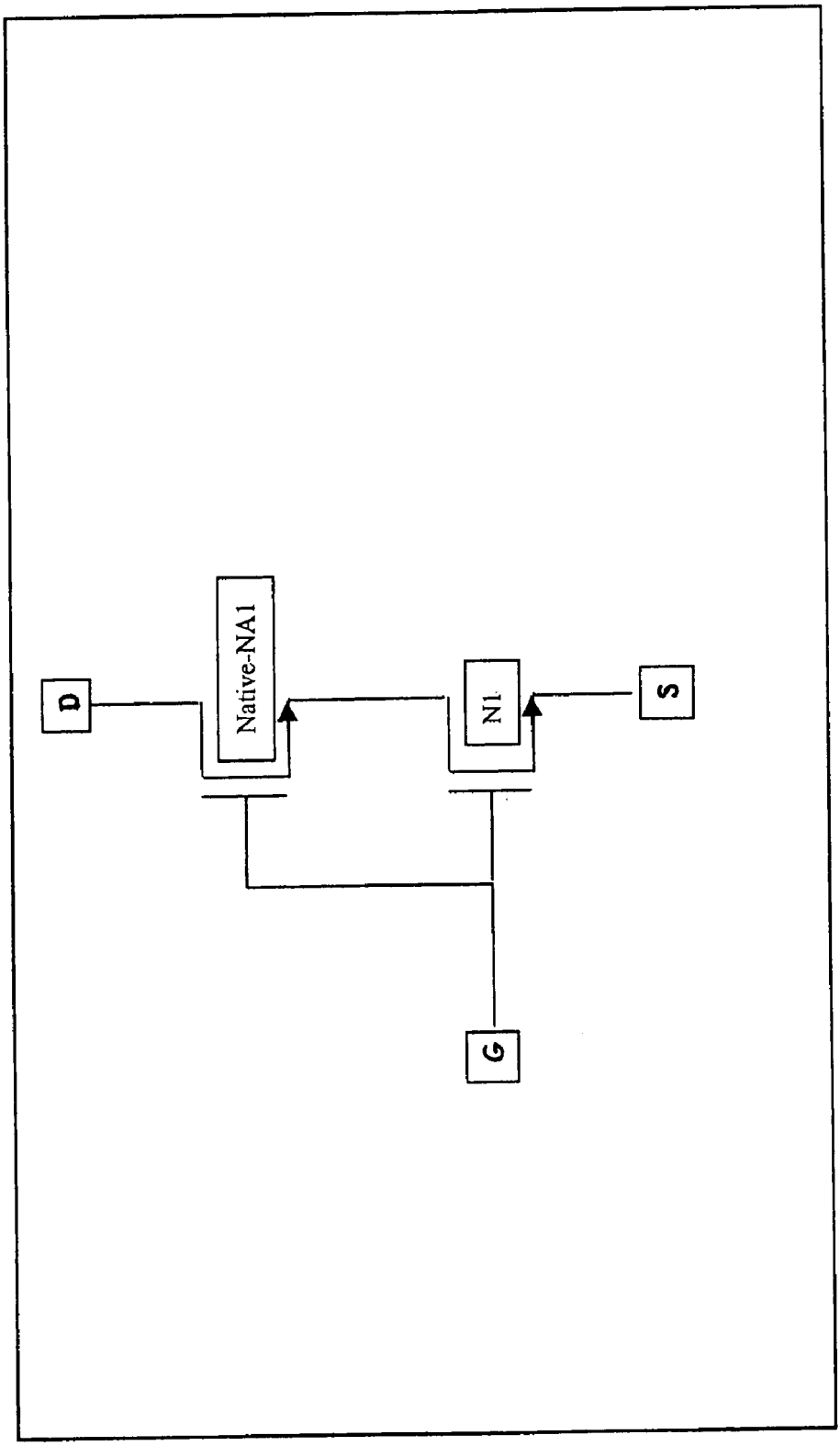
FIG. 1 is a diagram illustrating a native device cascode in accordance with the present invention.

The present invention seeks to mitigate the effects of decreased power supply rejection and increased channel length modulation in minimum or short channel length devices by using a device commonly available in advanced analog CMOS process technology called a 'Native' NMOS device, or alternatively, a low threshold NMOS device. The 'Native' device or '0 Vt' device (0V threshold voltage) is typically formed in the substrate without the use of a channel implant to alter the threshold voltage and/or to improve source-drain punch through. The benefits of the Native device are its near 0V threshold voltage that enables circuit operation under low supply voltages and with less overdrive than a standard minimum channel length device.

One embodiment of this invention (FIG. 1) uses a NMOS device N1 with a Native NMOS device NA1 stacked thereon, the two devices having a common gate connection to form a three terminal composite device having a source (S) connection, a drain (D) connection and a gate (G) connection. The Native device tends to clamp the drain voltage of MOS device N1 at the threshold voltage of MOS device N1 minus the threshold of Native device NA1 (approximately 0V), or approximately the threshold voltage of MOS device N1. Thus for a given gate-source (G-S) voltage of the composite device, the drain source voltage for MOS device N1 will tend to be isolated from variations in the drain-source (D-S) voltage for the composite device. Thus the resulting composite device has significantly lower channel length modulation and essentially the same output bandwidth as a standard NMOS device. Reduced channel length modulation results in improved linearity and power supply rejection. As such, the invention can be used in any typical source follower circuit application with significant improvements in linearity and power supply rejection. The invention specifically takes advantage of the threshold voltage difference between the stacked device and the drive device to allow a common-gate, cascode connection with superior properties of improved linearity and power supply rejection.

The present invention uses the Vt (threshold voltage) differences between 2 stacked devices, namely with a native device stacked on top of the short channel device, to form a composite device with improved output resistance. The difference in threshold voltages allows a common gate configuration to be employed while keeping the drive transistor N1 in saturation and simplifying biasing. More precisely, the following equation shows that the difference in gate-source voltage between the native transistor NA1 and basic short channel devices N1 allows the drain-source voltage on the short channel drive transistor N1 to exceed the saturation limit. More simply, the drive transistor N1 will remain in saturation, provided the gate-source voltage on the native device NA1 does not exceed the threshold voltage of the drive transistor.

Equation 1 (conditions for drive transistor to be in saturation) (see pg. 109 of "Bipolar and MOS Analog Integrated Circuit Design" by Alan B. Grebene):

$$Vds(N1) > Vgs(N1) - Vt(N1)$$

or $Vgs(N1) - Vgs(NA1) > Vgs(N1) - Vt(N1)$ or more simply, $Vgs(NA1) < Vt(N1)$ where:
- Vds=drain source voltage when conducting current I (or I plus the load current, i.e. typically the operating current for the device)
- Vgs=gate source voltage when conducting current I (or I plus the load current, i.e. the operating current for the device)
- Vt=threshold voltage FIG. 1 depicts the invention as a composite device comprised of NMOS device N1 with a stacked native NMOS device NA1. The performance can be compared to a single NMOS device in three key areas: output resistance, linearity and available input range. Compared to a single NMOS device, the output resistance Ro for the composite transistor is increased by Equation 2.

Equation 2: Ro is increased by a factor:

$$1+Ro(NA1)/Ro(N1)+(gm(NA1)+gmb(NA1))*Ro(NA1)$$

or Ro is increased approximately by the factor:

$$(gm(NA1)+gmb(NA1))*Ro(NA1)$$

where:
gm=change in drain current with a change in the gate-source voltage
gmb=change in drain current with a change in the body-source voltage For typical device parameters, equation 2 predicts a 5 to 10 times increase in effective output resistance of the composite transistor with the use of the stacked native device, resulting in improvements in power supply rejection and in linearity when used as a source follower.

The small signal gain of a source-follower circuit is given in Equation 3a.

Equation 3a: $Vo/Vi=1/(1+go/gm)$ where $go/gm=(dXd/dVds)*(Vgs-Vt)/(2*Leff)$
where the new parameters are defined as:
go=the change in drain current with a change in the drain-source voltage
Leff: effective channel length
Xd: drain-channel depletion region width
Also gmb=0 assuming an isolated device well connected to the source Although the term go/gm is fairly linear with a very small signal, for large signals as commonly processed by an A/D converter, the term is significantly non-linear as the transistor is biased in saturation and in the triode-saturation transition region of operation. Improving the distortion requires maximizing gm and minimizing go. Unfortunately for a single transistor, this is contradictory, as gm and go are proportional to Leff (i.e. effective channel length) and bias current.

Figure 2:
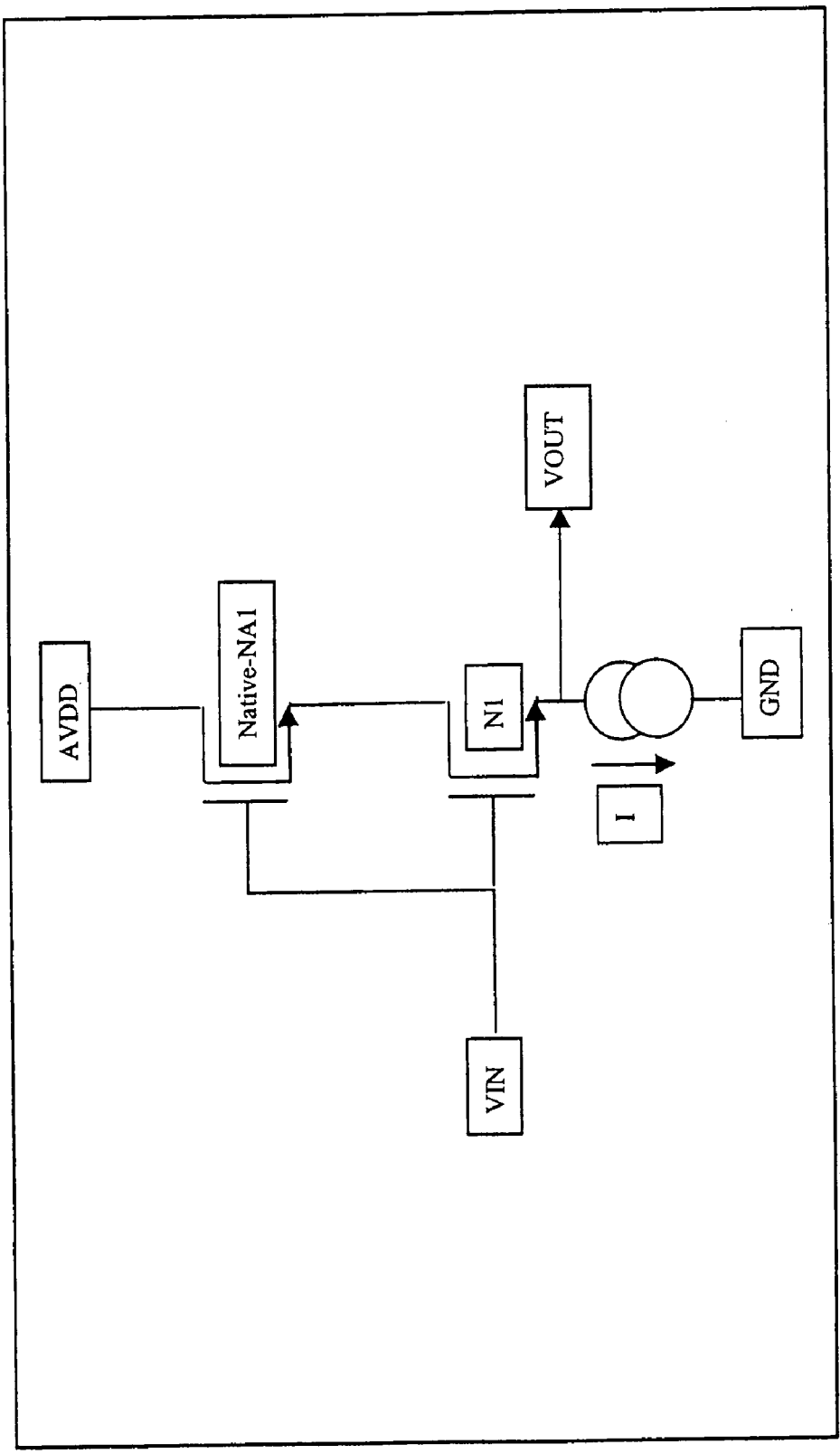
FIG. 2 is a diagram illustrating the use of a native device cascode in a source follower circuit.

FIG. 2 shows the use of a stacked native device in a source follower circuit. Here the composite device is coupled between the power supply AVDD and ground GND, with current source I providing a pull-down current for the output Vout. In some applications, the pull-down may be provided by the load itself as connected to the output Vout. By using a stacked native device in a source follower circuit as shown in FIG. 2, the small signal gain can be expressed approximately as Equation 3b.

Equation 3b: $Vout/Vin=1/(1+goeff/gmeff)$ where $goeff=[go(NA1)*go(N1)]/[gm(NA1)+gmb(NA1)]$
or more simply, since gmb(NA1) is small by design:
$goeff=go(N1)*[go(NA1)/gm(NA1)]$, and
$gmeff=gm(N1)+go(N1)*[go(NA1)/gm(NA1)]$
where: eff designates the value of the respective parameter for the composite transistor Again, for typical device parameters, goeff is reduced by a factor of 5 to 10, while the effective gm of the composite device benefits from a reduced output conductance as well. The combined improvements in these two terms significantly improve the large signal linearity of the basic source-follower circuit.

Figure 3:
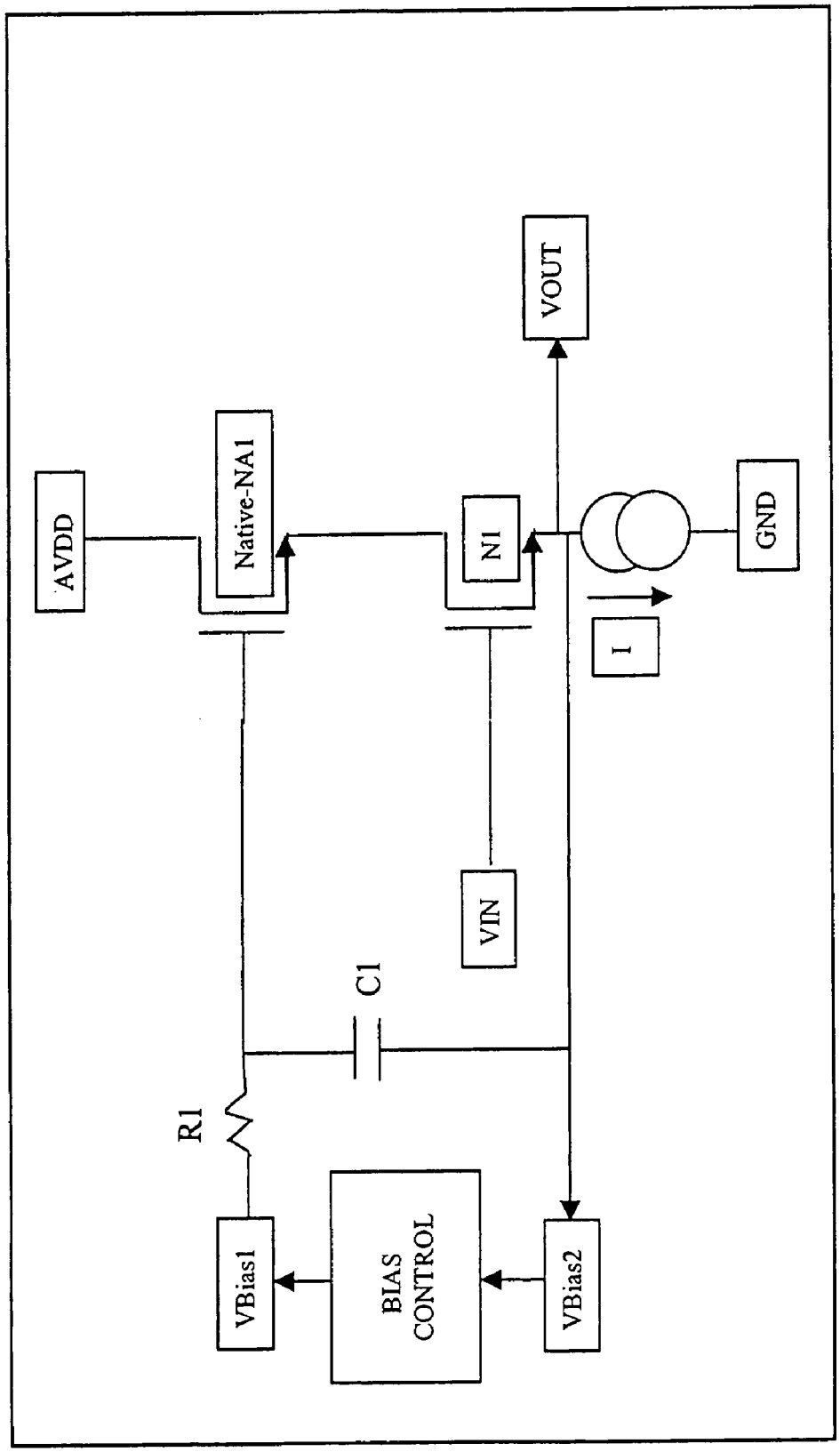
FIG. 3 is a diagram illustrating the use of a native device cascode in a source follower circuit with AC coupled biasing of the gate of the native device referenced to the output of the source follower circuit.

Obtaining optimum linearity requires precise control of the voltage across the drain-source (Vds) of drive device N1 over temperature and process corners. A possible circuit variant to achieve this control is shown in FIG. 3. Here the gate of the stacked native device is driven by the source follower output through an AC coupling capacitor. Equation 4 shows that the drain-source voltage on device N1 is determined by the difference between bias voltages Vbias1 and Vbias2. This difference can be made a function of Vgs(NA1) and can thus be made to yield a constant bias over process and temperature.

Equation 4: $Vds(N1)=Vbias1-Vbias2-Vgs(NA1)$

Where:
Vbias1=the gate bias voltage on the Native device NA1
Vbias2=the output bias voltage on the Short channel device NA1

FIG. 3 depicts self-biasing the gate of the native device through an AC coupling capacitor C1. The DC bias level at the gate of the native device NA1 is set through a large bias resistor R1 connected to a common-mode reference voltage. There are several advantages to the configuration shown in FIG. 3. First, the DC bias level may be generated from a common reference circuit that also provides a reference voltage for either the source follower input or output common-mode voltage in a differential output circuit. By having the common mode voltages at the native NMOS gate and the source follower output (FIG. 3) or input (FIG. 4) referenced to the same source, excellent tracking of the Vds (i.e. drain-source bias voltage) of the minimum channel length NMOS may be obtained over temperature and process corners. Maintaining an optimum Vds biasing of the minimum channel length NMOS is important to maintaining excellent linearity over temperature and process corners.

The use of the present invention allows the achievement of excellent linearity for a source follower circuit in a low voltage supply, state of the art CMOS process technology. Excellent linearity is an essential property for such applications as a high resolution, high quality analog to digital converter. Achieving the maximum bandwidth and sampling rate requires the usage of minimum channel length devices because of their improved speed (i.e. ft) and reduced bulk parasitics. However, as the channel length is reduced, the output conductance increases significantly and causes degradation in the circuit linearity. This invention allows a significant improvement in the linearity of the basic source follower, while maintaining adequate headroom for large signal processing.

Thus, as CMOS technologies scale to lower channel lengths, one of the main sources of non-linearity is channel-length modulation. Also, as CMOS technology scales the supply voltage is reduced, prohibiting the use of a conventional cascode device. The native device cascode of the present invention solves both problems as it 1) increases the impedance relative to the power supply and thus reduces the effect of channel-length modulation, and 2) has a small Vgs which allows it to be compatible with scaling/reduced supply voltages.

Although the present invention has been disclosed in reference to a NMOS native or '0 Vt' device stacked on a minimum channel length NMOS device, the circuit can be implemented with any device with a smaller Vt than the minimum channel length device. For example, medium Vt (higher than zero but less than the threshold of device N1) devices exist in most advanced CMOS process technologies and may possibly be employed in implementing a circuit of the type described here. The present invention utilizes the threshold voltage differences between two stacked devices, namely with the native or lower threshold device stacked on top of the basic short channel device, to form a composite device with improved output resistance. The difference in threshold voltages allows a common gate configuration to be employed while keeping the drive transistor in saturation and simplifying biasing.

Figure 4:
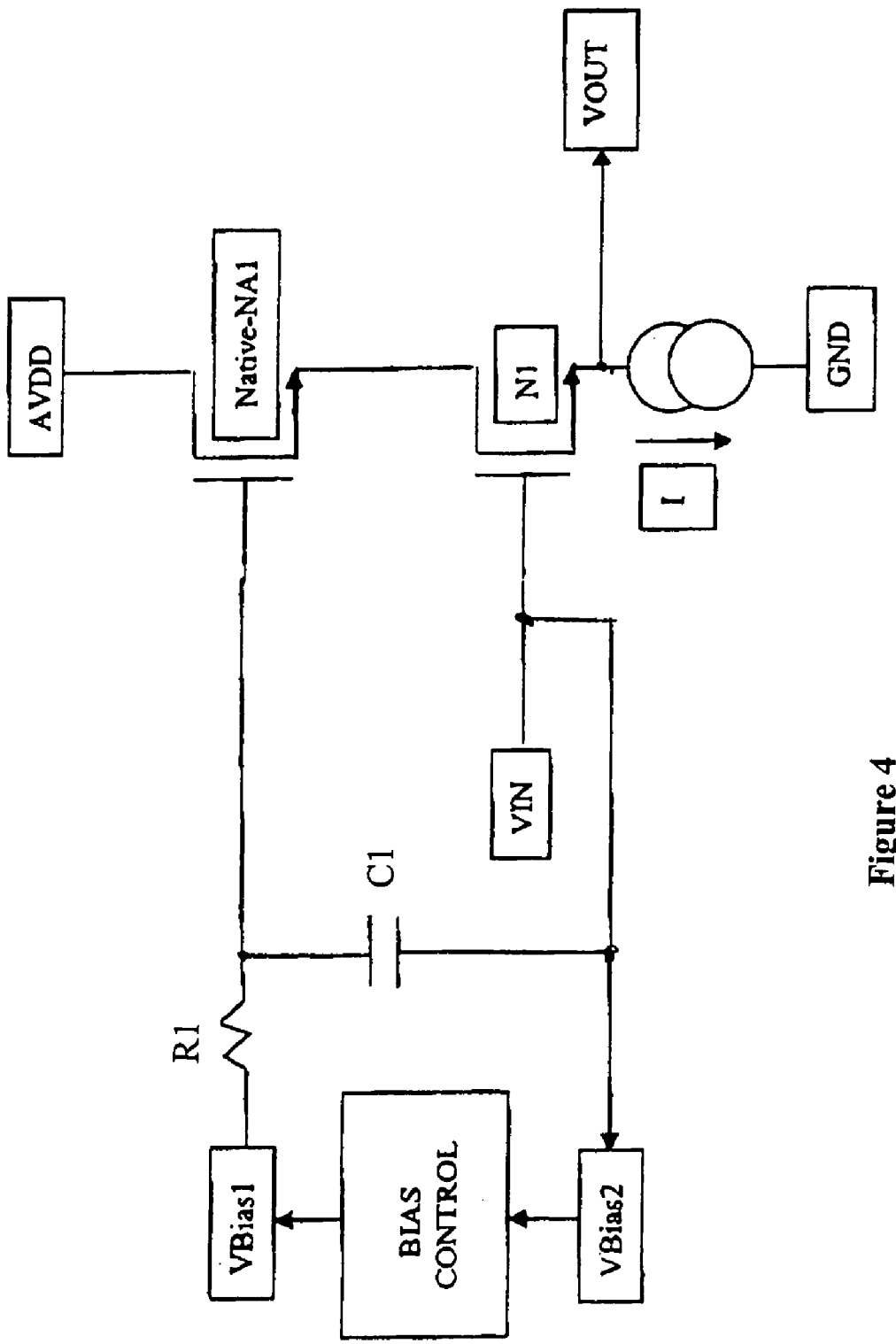
FIG. 4 is a diagram illustrating the use of a native device cascode in a source follower circuit with AC coupled biasing of the gate of the native device referenced to the input to the source follower.
Figure 5:
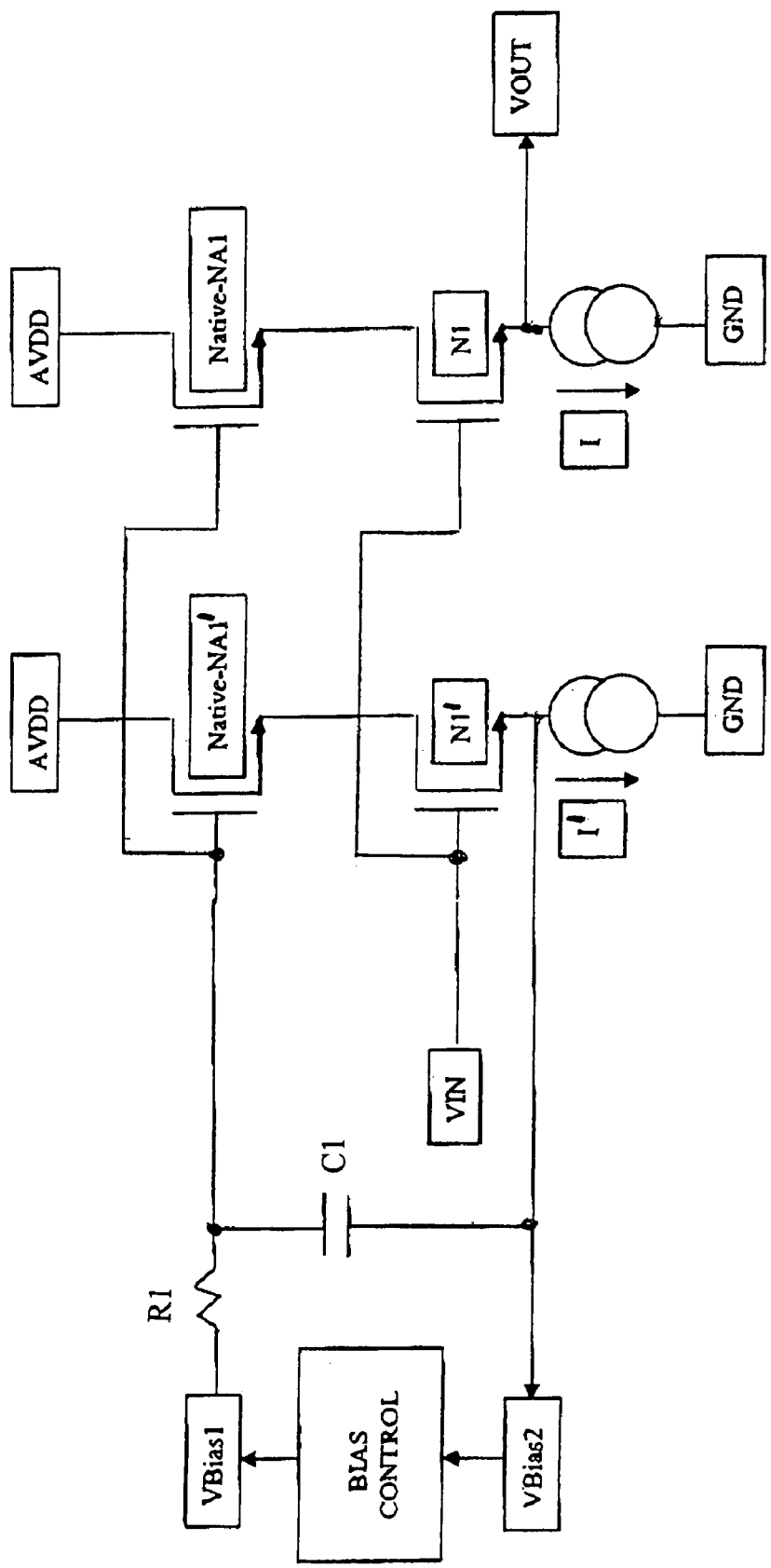
FIG. 5 is a diagram similar to that of FIG. 4, but with the AC coupled bias point at the gate of device NA1 driven from an independent or replica source follower leg.

FIG. 3 shows an embellishment of the circuit implemented with an AC coupled bias of the native device (NA1) gate. The AC coupled bias can also be derived directly from the 'VIN' terminal. In other words, the AC-coupled capacitor can be connected between nodes 'VIN' and the gate of the native device (FIG. 4). The AC coupled bias point at the gate of device NA1 can also be driven from an independent or replica source follower leg, as shown on FIG. 5. Here replica transistors N' and NA' and current source I' provide a replica of the output of the primary composite device for coupling to the bias control. This may have the additional benefit of reducing the capacitive loading of the drive transistor N1 of the primary composite device. It does somewhat increase the capacitive loading on the input signal Vin, though the replica devices may be scaled downward in size to minimize this effect.

In the foregoing disclosure, certain embodiments of the invention have been described in detail, not for purposes of limitation, but rather for purposes of conveying a more general understanding of various aspects of the invention. Thus while certain preferred embodiments of the present invention has been disclosed and described herein, it will be understood by those skilled in the art that various changes in form and detail may be made therein without departing from the spirit and scope of the invention.

What is claimed is:

1. A composite NMOS device having a source connection, a drain connection and a gate connection for conducting an operating current comprising:
   a first NMOS device having a source, a drain and a gate;
   a second NMOS device having a source, a drain and a gate;
   the source of the second NMOS device being connected to the drain of the first NMOS device;
   the gates of the first and second NMOS devices being coupled together through a bias control, the bias control providing a different bias to the gates of the first and second NMOS devices;
   the gate of the first NMOS device being coupled to the gate connection, the drain of the second NMOS device being coupled to the drain connection and the source of the first transistor being coupled to the source connection;
   the second NMOS device having a lower threshold voltage than the first NMOS transistor.

2. The composite NMOS device of claim 1 wherein the gates of the first and second NMOS devices are connected together, and wherein the threshold of the first NMOS device exceeds the gate-source voltage of the second NMOS device when conducting the operating current.

3. The composite NMOS device of claim 2 wherein the second NMOS device is a native device.

4. The composite NMOS device of claim 2 wherein the second NMOS device has a substantially zero threshold.

5. The composite device of claim 1 wherein the bias control provides biases on the gates of the first and second NMOS devices so that the bias on the gate of the second NMOS device minus the bias on the gate of the first NMOS device is a function of the gate source voltage of the second NMOS device to compensate for variations in temperature and processing.

6. The composite NMOS device of claim 1 wherein the bias control is coupled to the gate of the second NMOS device through a resistor, and wherein the gates of the first and second NMOS devices are AC coupled together.

7. A composite NMOS device having a source connection, a drain connection and a gate connection for conducting an operating current comprising:
   a first NMOS device having a source, a drain and a gate;
   a second NMOS device having a source, a drain and a gate;
   the source of the second NMOS device being connected to the drain of the first NMOS device;
   the gate of the second NMOS device being coupled to the source of the first NMOS device;
   the gate of the first NMOS device being coupled to the gate connection, the drain of the second NMOS device being coupled to the drain connection and the source of the first transistor coupled to the source connection;
   the second NMOS device having a lower threshold voltage than the first NMOS transistor.

8. The composite NMOS device of claim 7 wherein the second NMOS device is a native device.

9. The composite NMOS device of claim 7 wherein the second NMOS device has a substantially zero threshold.

10. The composite NMOS device of claim 7 wherein the gate of the second NMOS device is coupled to the source of the first NMOS device through a bias control.

11. The composite NMOS device of claim 10 wherein the bias control compensates for variations in temperature and processing.

12. The composite NMOS device of claim 11 wherein the bias control is coupled to the gate of the second NMOS device through a resistor, and wherein the gates of the first and second NMOS devices are AC coupled.

13. A source follower for conducting an operating current, the source follower having a positive power supply connection, a circuit ground connection, a source follower input connection and a source follower output connection comprising:
    a first NMOS device having a source, a drain and a gate;
    a second NMOS device having a source, a drain and a gate; and
    a current source;
    the source of the second NMOS device being connected to the drain of the first NMOS device;
    the gates of the first and second NMOS devices being coupled together;
    the gate of the first NMOS device being coupled to the source follower input connection, the drain of the second NMOS device being coupled to the positive power supply connection and the source of the first transistor being coupled to the source follower output connection and through the current source to the circuit ground connection;
    the second NMOS device having a lower threshold voltage than the first NMOS transistor.

14. The source follower of claim 13 wherein the gates of the first and second NMOS devices are connected, and wherein the threshold of the first NMOS device exceeds the gate-source voltage of the second NMOS device when conducting the operating current.

15. The source follower device of claim 14 wherein the second NMOS device is a native device.

16. The source follower device of claim 14 wherein the second NMOS device has a substantially zero threshold.

17. The source follower device of claim 13 wherein the gates of the first and second NMOS devices are coupled through a bias control.

18. The source follower of claim 17 wherein the bias control provides biases on the gates of the first and second NMOS devices so that the bias on the gate of the second NMOS device minus the bias on the gate of the first NMOS device is a function of the gate source voltage of the second NMOS device to compensate for variations in temperature and processing.

19. The source follower of claim 17 wherein the bias control is coupled to the gate of the second NMOS device through a resistor, and wherein the gates of the first and second NMOS devices are AC coupled.

20. A source follower for conducting an operating current, the source follower having a positive power supply connection, a circuit ground connection, a source follower input connection and a source follower output connection comprising:
   a first NMOS device having a source, a drain and a gate;
   a second NMOS device having a source, a drain and a gate; and
   a current source;
   the source of the second NMOS device being connected to the drain of the first NMOS device;
   the gate of the second NMOS device being coupled to the source of the first NMOS device;
   the gate of the first NMOS device being coupled to the source follower input connection, the drain of the second NMOS device being coupled to the positive power supply connection and the source of the first transistor being coupled to the source follower output connection and through the current source to the circuit ground connection;
   the second NMOS device having a lower threshold voltage than the first NMOS transistor.

21. The source follower of claim 20 wherein the second NMOS device is a native device.

22. The source follower of claim 20 wherein the second NMOS device has a substantially zero threshold.

23. The source follower claim 20 wherein the gate of the second NMOS device is coupled to the source of the first NMOS device through a bias control.

24. The source follower of claim 23 wherein the bias control compensates for variations in temperature and processing.

25. The source follower of claim 24 wherein the bias control is coupled to the gate of the second NMOS device through a resistor, and wherein the gates of the first and second NMOS devices are AC coupled.

26. A composite NMOS device having a source connection, a drain connection and a gate connection for conducting an operating current comprising:
   first and second NMOS devices each having a source, a drain and a gate;
   third and fourth NMOS devices each having a source, a drain and a gate;
   the sources of the third and fourth NMOS devices being connected to the drains of the first and second NMOS devices, respectively;
   the gates of the third and fourth NMOS devices being coupled together and to a bias voltage;
   the gates of the first and second NMOS devices being coupled together and to the gate connection;
   the drains of the third and fourth NMOS devices being coupled to the drain connection;
   the source of the first devices being capacitively coupled to the gates of the third and fourth NMOS devices;
   the source of the second NMOS device being coupled to the source connection;
   the third and fourth NMOS devices having lower threshold voltages than the first and second NMOS devices.

27. The composite NMOS device of claim 26 wherein the first and third NMOS devices are replica devices for the second and fourth NMOS devices, respectively.

28. The composite NMOS device of claim 26 wherein the third and fourth NMOS devices are native devices.

29. The composite NMOS device of claim 26 wherein the third and fourth NMOS devices have a substantially zero threshold.

30. A composite NMOS device having a source connection, a drain connection and a gate connection for conducting an operating current comprising:
   a first NMOS device having a source, a drain and a gate;
   a second NMOS device having a source, a drain and a gate;
   the source of the second NMOS device being connected to the drain of the first NMOS device;
   the gates of the first and second NMOS devices being coupled together through a bias control, the bias control;
   the gate of the first NMOS device being coupled to the gate connection, the drain of the second NMOS device being coupled to the drain connection and the source of the first transistor being coupled to the source connection;
   the second NMOS device having a lower threshold voltage than the first NMOS transistor;
   the bias control is coupled to the gate of the second NMOS device through a resistor, and wherein the gates of the first and second NMOS devices are AC coupled together.

31. A source follower for conducting an operating current, the source follower having a positive power supply connection, a circuit ground connection, a source follower input connection and a source follower output connection comprising:
   a first NMOS device having a source, a drain and a gate;
   a second NMOS device having a source, a drain and a gate; and
   a current source;
   the source of the second NMOS device being connected to the drain of the first NMOS device;
   the gates of the first and second NMOS devices being coupled together through a bias control;
   the gate of the first NMOS device being coupled to the source follower input connection, the drain of the second NMOS device being coupled to the positive power supply connection and the source of the first transistor being coupled to the source follower output connection and through the current source to the circuit ground connection;
   the second NMOS device having a lower threshold voltage than the first NMOS transistor;
   the bias control being coupled to the gate of the second NMOS device through a resistor, and wherein the gates of the first and second NMOS devices are AC coupled.

* * * * *